(12) United States Patent
Park et al.

(10) Patent No.: US 8,895,425 B2
(45) Date of Patent: Nov. 25, 2014

(54) METHOD OF FORMING CHANNEL LAYER OF ELECTRIC DEVICE AND METHOD OF MANUFACTURING ELECTRIC DEVICE USING THE SAME

(75) Inventors: Young June Park, Seoul (KR); Seok Ha Lee, Asan-si (KR); Jun Ho Chun, Seoul (KR); Yeonkyu Choi, Seoul (KR)

(73) Assignee: SNU R&DB Foundation, Seoul (KR)

( * ) Notice: Subject to any disclaimer, the term of this patent is extended or adjusted under 35 U.S.C. 154(b) by 97 days.

(21) Appl. No.: 13/616,773

(22) Filed: Sep. 14, 2012

(65) Prior Publication Data

US 2014/0080274 A1  Mar. 20, 2014

(51) Int. Cl.
| | |
|---|---|
| *H01L 21/20* | (2006.01) |
| *H01L 21/3205* | (2006.01) |
| *C25D 5/00* | (2006.01) |
| *C25D 7/12* | (2006.01) |
| *C25D 3/02* | (2006.01) |
| *H01L 21/208* | (2006.01) |

(52) U.S. Cl.
CPC ............... *H01L 21/208* (2013.01); *C25D 3/02* (2013.01)
USPC ............ 438/584; 438/586; 438/674; 205/80; 205/118; 205/157

(58) Field of Classification Search
USPC ............ 438/584, 586, 597, 674; 205/80, 118, 205/157–159
See application file for complete search history.

(56) References Cited

U.S. PATENT DOCUMENTS

| | | | |
|---|---|---|---|
| 6,555,158 B1 * | 4/2003 | Yoshio et al. ................. | 438/643 |
| 7,368,045 B2 * | 5/2008 | Vereecken et al. ............ | 205/118 |
| 8,318,552 B2 * | 11/2012 | Tokie et al. .................... | 438/158 |
| 2011/0045577 A1 | 2/2011 | Bruzewicz et al. | |

FOREIGN PATENT DOCUMENTS

| | | |
|---|---|---|
| KR | 100155826 B | 7/1998 |
| KR | 1020080023303 A | 3/2008 |

* cited by examiner

*Primary Examiner* — Hsien Ming Lee
(74) *Attorney, Agent, or Firm* — Sherr & Jiang, PLLC

(57) ABSTRACT

A method of forming a channel layer of an electric device according to an embodiment is provided. First, a conductive substrate including an insulating layer on the substrate is provided. The conductive substrate and a metal to be plated are used as respective electrodes to carry out electroplating within an electrolyte solution. In this case, electrons provided by a tunneling current passing through the insulating layer from the conductive substrate are bonded with ions of the metal within the electrolyte solution to form a metal channel layer on the insulating layer.

17 Claims, 12 Drawing Sheets

METHOD OF FORMING CHANNEL LAYER
OF ELECTRIC DEVICE AND METHOD OF
MANUFACTURING ELECTRIC DEVICE
USING THE SAME

TECHNICAL FIELD

The described technology relates generally to a method of manufacturing an electric device and, more particularly, to a method of forming a channel layer of an electric device and a method of manufacturing the electric device using the same.

BACKGROUND

An electric device technology, for example, a semiconductor device technology has been remarkably developed up to now. In particular, a memory device such as DRAM requiring a high integration degree has been required to have active and passive elements with smaller feature sizes, and the semiconductor device and the process technology have correspondingly reduced the feature sizes.

However, when a channel layer is implemented to have a length of 50 nm or less in a transistor, a short channel effect occurs to make it difficult to implement the device. A doping concentration of the channel layer has been made to be increased to temporarily solve the above problem so far. However, it is required to fundamentally solve the above problem when the feature size is more reduced. Some researches have proposed a Recess Channel Array Transistor (RCAT) in which a channel region below a gate of the transistor is recessed to increase an effective gate length or a Spherical Recess Channel Array Transistor (SRCAT) allowing a threshold voltage to be decreased in comparison with the RCAT. Other researches have proposed a vertical transistor in which a channel between a source and a drain is completely surrounded by a gate. Although the structural change in transistor has been tried to overcome the short channel effect, the manufacturing process thereof is complicated.

Nowadays, in order to overcome the performance degradation due to the reduction in feature size, a transistor structure having a metal channel layer is proposed. By forming the channel layer of the transistor with a metal, a mobility of the charges in the channel layer can be improved, and a leakage current occurring due to the short channel effect can thus be reduced. Accordingly, when more attentions are focused on the transistor structure having the metal channel layer, a research on a method capable of reliably manufacturing the transistor having the metal channel layer is also required.

SUMMARY

In one embodiment, a method of forming a metal channel layer having a sufficiently short length, width, and thickness within an electric device is provided.

In another embodiment, a method of manufacturing an electric device including a metal channel layer having a sufficiently short length, width, and thickness within an electric device is provided.

A method of forming a channel layer of an electric device according to an aspect of the present disclosure is provided. The method includes providing a conductive substrate having an insulating layer on the substrate. The conductive substrate and a metal to be plated are used as respective electrodes to carry out electroplating within an electrolyte solution. In this case, electrons provided by a tunneling current passing through the insulating layer from the conductive substrate are bonded with ions of the metal within the electrolyte solution to form a metal channel layer on the insulating layer.

In one embodiment, the metal may be gold, silver, platinum, aluminum, lead, hafnium, tantalum, titanium, copper, tin, or palladium.

In another embodiment, in the process of carrying out the electroplating, a voltage may be applied so as to make the metal have a positive polarity and the conductive substrate having a negative polarity within the electrolyte solution.

In still another embodiment, in the process of carrying out the electroplating, the electrolyte solution may include a surface active agent, and the surface active agent may cause the metal channel layer to be formed on the insulating layer in a unit of atomic layer.

In yet another embodiment, on the insulating layer, at least one electrode layer is formed and in the process of forming the metal channel, the process of bonding the ions of the metal with the electrons is stopped on the metal channel layer when the metal channel layer is connected to the at least one electrode layers.

A method of manufacturing an electric device according to another aspect of is the present disclosure is provided. The method includes forming an insulating layer on a conductive substrate. A source electrode layer and a drain electrode layer are formed to be spaced from each other on the insulating layer. The conductive substrate including the insulating layer, the source electrode layer and the drain electrode layer is immersed into the electrolyte solution. The conductive substrate and a metal to be plated are used as respective electrodes to carry out electroplating. In this case, electrons of a tunneling current passing through the insulating layer from the conductive substrate are bonded with ions of the metal within the electrolyte solution to form a metal channel layer between the source electrode layer and the drain electrode layer.

In one embodiment, carrying out the electroplating may include applying a voltage between the source electrode layer and the drain electrode layer and measuring a current flowing between the source electrode layer and the drain electrode layer to determine whether the electroplating forming the channel metal layer is completed.

In another embodiment, the method of manufacturing the electric device may further include forming an upper gate dielectric film on the channel metal layer and forming an upper gate electrode layer on the upper gate dielectric film.

In still another embodiment, the electrolyte solution may include a surface active agent, and the surface active agent may cause the metal channel layer to be formed on the insulating layer in a unit of atomic layer.

A method of manufacturing an electric device according to still another aspect of the present disclosure is provided. The method includes forming an insulating layer on a conductive substrate. A source electrode lay and a drain electrode layer are formed to be spaced from each other on the insulating layer. Abuse metal layer is formed on the conductive substrate including the insulating layer, the source electrode is layer, and the drain electrode layer. A photoresist is applied on the conductive substrate, and a photoresist exposing a portion of the base metal layer is formed through a lithography process. The exposed portion of the base metal layer is removed to expose a portion of the insulating layer. The conductive substrate and a metal to be plated are used as respective electrodes within an electrolyte solution to carry out electroplating. In this case, electrons of a tunneling current passing through the insulating layer from the conductive substrate are bonded with ions of the metal within the electrolyte solution to form a metal channel layer on the portion of the insulating layer.

In one embodiment, the photoresist pattern may determine a length and a width of the metal channel layer to be formed by the electroplating.

In another embodiment, in the process of removing the exposed portion of the base metal layer, the conductive substrate on which the photoresist pattern is formed may be provided with an electrolyte solution. A voltage may be applied to the electrolyte solution and the conductive substrate to carry out electrolysis on the electrolyte solution. In this case, the exposed metal of the base metal layer may be ionized into the electrolyte solution by an oxidation reaction of the electrolysis to cause the exposed portion of the base metal layer to be etched.

In still another embodiment, in the process of carrying out the electroplating, a voltage may be applied between the source electrode layer and the drain electrode layer, and a current flowing between the source electrode layer and the drain electrode layer may be measured to determine whether the electroplating forming the metal channel layer is completed.

In yet another embodiment, the method of manufacturing the electric device may further include forming an upper gate dielectric film on the metal channel layer and forming an upper gate electrode layer on the upper gate dielectric film.

In yet another embodiment, in the process of carrying out the electroplating, the electrolyte solution may include a surface active agent, and the surface active agent may cause the metal channel layer to be formed on the insulating layer in a unit of atomic layer.

An electric device according to yet another aspect of the present disclosure is provided. The electric device includes a substrate having a gate electrode layer within the substrate, a source electrode layer and a drain electrode layer disposed to be spaced from each other on the gate insulating layer, a source extension layer and a drain extension layer extending from the respective source electrode layer and the drain electrode layer and disposed to face each other, and a metal channel layer electroplated and disposed between the source extension layer and the drain extension layer.

In one embodiment, the source extension layer, the drain extension layer, and the metal channel layer may be formed of the same metal.

According to the present disclosure, an electroplating method using a tunneling current is applied, so that a metal channel layer having a sufficiently thin thickness can be formed.

According to the present disclosure, an electrolysis method of the electrolyte solution may be applied as a method of patterning a channel layer, and an electroplating method using a tunneling current may be applied as a method of forming a metal channel layer. Accordingly, an electric device having a metal channel layer with a sufficiently short length, width, and thickness required in the art can be manufactured.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

BRIEF DESCRIPTION OF THE DRAWINGS

The above and other features and advantages of the present disclosure will become more apparent to those of ordinary skill in the art by describing in detail example embodiments thereof with reference to the attached drawings in which.

DETAILED DESCRIPTION

It will be readily understood that the components of the present disclosure, as generally described and illustrated in the Figures herein, could be arranged and designed in a wide variety of different configurations. Thus, the following more detailed description of the embodiments of apparatus and methods in accordance with the present disclosure, as represented in the Figures, is not intended to limit the scope of the disclosure, as claimed, but is merely representative of certain examples of embodiments in accordance with the disclosure. The presently described embodiments wilt be best understood by reference to the drawings, wherein like parts are designated by like numerals throughout. Moreover, the drawings are not necessarily to scale, and the size and relative sizes of the layers and regions may have been exaggerated for clarity.

It will also be understood that when an element or layer is referred to as being "on," another element or layer, the element or layer may be directly on the other element or layer or intervening elements or layers may be present. As used herein, the term "and/or" may include any and all combinations of one or more of the associated listed items.

Figure 1:
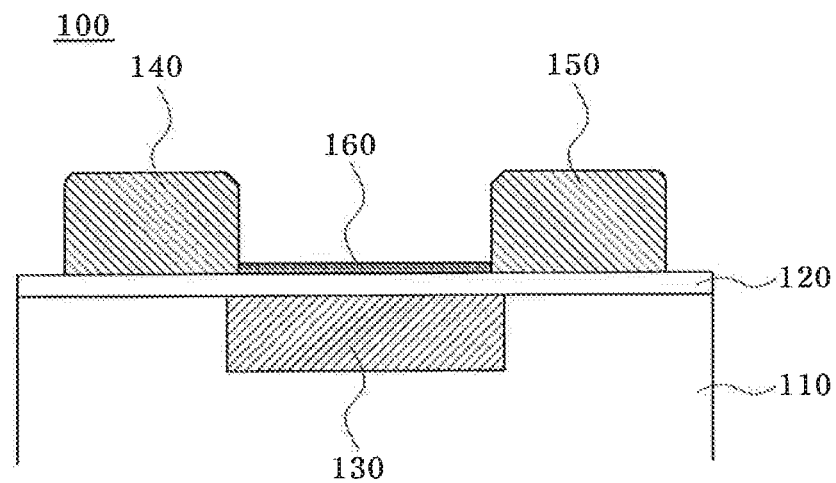
FIG. 1 is a schematic diagram illustrating an electric device according to an embodiment of the present disclosure.

FIG. 1 is a schematic diagram illustrating an electric device according to an embodiment of the present disclosure. Referring to FIG. 1, an electric device 100 includes a substrate 110 having a gate electrode layer 130, an insulating layer 120 disposed on the substrate 110, a source electrode layer 140 and a drain electrode layer 150 disposed to be spaced from each other on the insulating layer 120, and a metal channel layer 160 disposed between the source electrode layer 140 and the drain electrode layer 150. The electric device 100 may be a switching device, for example. A voltage may be applied between the source electrode layer 140 and the drain electrode layer 150 to make charges conductive through the metal channel layer 160. A gate voltage applied to the gate electrode layer 130 may form an electric field in the metal channel layer 160 to control movement of the charges. The metal channel layer 160 of the electric device 100 may operate in a similar way to a channel layer of a MOS transistor when the thickness of the metal channel layer is several nm. That is, in accordance with an externally applied voltage, depletion, accumulation, and inversion phenomena may occur in the metal channel layer 160, so that electrons or holes having charges may be conductive. The electric device 100 may be, for example, a transistor operating in a depletion mode. In a turn-on operation of the transistor, when a predetermined voltage is applied between the source electrode layer 140 and the drain electrode layer 150, electrons or holes having charges may be conductive along the metal channel layer 160. In a turn-off operation of the transistor, when a predetermined gate voltage is applied to the gate electrode layer 130, an electric field causing the depletion phenomenon of the charges to occur may be formed in the metal channel layer 160. Accordingly, the electrons or holes moving along the metal channel layer 160 may be blocked. The electric device 100 may be, for example, a transistor operating in an enhancement mode. When a voltage is applied between the source electrode layer 140 and the drain electrode layer 150, the electrons or holes are not conductive along the metal channel layer 160 but remain in a turn-off state. In the turn-on operation of the transistor, when a predetermined gate voltage is applied to the gate electrode layer 130, an accumulation layer or an inversion layer of the charges may is be formed in the metal channel layer 160, and the electrons or holes may move between the source electrode layer 140 and the drain electrode layer 150 along the accumulation layer or the inversion layer. In the turn-off operation of the transistor, the accumulation layer or the inversion layer formed in the metal channel layer 160 may be removed by removing the predetermined gate voltage applied to the gate electrode layer 130. The electrons or holes flowing between the source electrode layer 140 and the drain electrode layer 150 can thus be blocked. In this manner, the electric device 100 may operate as a switching device. A theory of the switching device using the metal channel layer 160 described above is disclosed in, for example, the International Publication No. WO 2005/093868, which forms a part of the content of the present disclosure.

In the electric device 100, the substrate 110 may be a conductive substrate. In the specification, the conductivity of the substrate may be defined to include both of a case that the entire substrate has the conductivity and a case that a portion of the substrate has the conductivity due to the conductive pattern or the conductive circuit formed within the substrate. For example, the substrate 110 may be a doped semiconductor substrate, a metal substrate, a conductive metal oxide, or a conductive polymer substrate. Alternatively, the substrate 110 may be manufactured by forming a conductive pattern within an insulating substrate or a semiconductor substrate. The semiconductor substrate may be, for example, Si, Ge, GaAs, InP, and so forth. The insulating substrate may be, for example, a silicon oxide, an aluminum oxide, a diamond, and so forth.

The substrate 110 may include an integrated circuit (not shown) in the substrate, and may transceive an electric signal. The substrate 110 may include the gate electrode layer 130. The gate electrode layer 130 may externally receive a gate voltage, and form an electric field in the metal channel layer 160. The electric field may cause depletion, accumulation, and inversion phenomena of the charges to occur on the metal channel layer 160. The gate electrode layer 130 may be formed of a conductive pattern, and may be formed from a doped semiconductor, metal, a metal suicide, or a conductive metal oxide.

The insulating layer 120 is disposed on the substrate 110. The insulating layer 120 may correspond to the gate electrode layer 130 to act as a gate insulating film. The insulating layer 120 may be formed of, for example, a silicon oxide film, a silicon nitride oxide film, a silicon nitride film, a hafnium oxide film, a tantalum oxide film, a titanium oxide film, or an aluminum oxide film. For example, when the substrate 110 is formed of a material such as silicon, the insulating layer 120 may be a silicon oxide formed by oxidizing silicon by means of a thermal oxidation method. The insulating layer 120 may be formed to have a thickness of 10 Å to 200 Å, for example.

The source electrode layer 140 and the drain electrode layer 150 are disposed to be spaced from each other on the insulating layer 120. When a voltage is externally applied between the source electrode layer 140 and the drain electrode layer 150, the source electrode layer 140 and the drain electrode layer 150 act to provide or receive electrons or holes along the metal channel layer 160. The source electrode layer 140 and the drain electrode layer 150 may be formed of conductive patterns, and may be formed from a doped semiconductor, a metal, a metal suicide, or a conductive metal oxide, for example.

The metal channel layer 160 is disposed between the source electrode layer 140 and the drain electrode layer 150. The metal channel layer 160 may be formed from gold, silver, platinum, aluminum, lead, hafnium, tantalum, titanium, copper, tin, or palladium, for example. The metal channel layer 160 may include at least one layer of a metal atom layer, for example, and may have a thickness of about 5 Å or more. According to an embodiment, in a case of the transistor in the depletion mode causing electrons to be conductive, a predetermined negative voltage may be applied to the gate electrode layer 130 to cause the depletion of the charged electrons to occur in the metal channel layer 160. Accordingly, even when the predetermined voltage is applied between the source electrode layer 140 and the drain electrode layer 150, the electrons are not conductive between the source electrode layer 140 and the drain electrode layer 150. According to another embodiment, in a case of the transistor in an enhancement mode causing electrons to be conductive, a predetermined positive voltage may be applied to the gate electrode layer 130 to cause accumulation or inversion of the charged electrons to occur in the metal channel layer 160. Accordingly, when a predetermined voltage is applied between the source electrode layer 140 and the drain electrode layer 150, the electrons may be conductive between the source electrode layer 140 and the drain electrode layer 150. According to another embodiment, the transistor causing the holes present within the metal channel layer to move the charges may also operate in the substantially same depletion and enhancement modes as the method described above. For example, driving the switching device using the metal as the channel layer is to disclosed in the International Publication No. WO 2005/093868, which forms a part of the content of the present disclosure.

Figure 2:
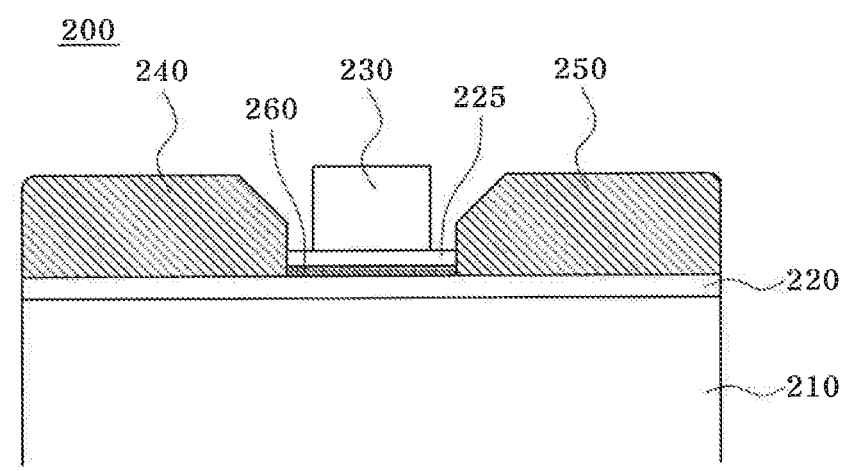
FIG. 2 is a schematic diagram illustrating an electric device according to another embodiment of the present disclosure.

FIG. 2 is a schematic diagram illustrating an electric device according to another embodiment of the present disclosure. Referring to FIG. 2, the electric device 200 includes a substrate 210, an insulating layer 220 disposed on the substrate 210, a source electrode layer 240 and a drain electrode layer 250 disposed to be spaced from each other on the insulating layer 220, and a metal channel layer 260 disposed between the source electrode layer 240 and the drain electrode layer 250. The electric device 200 includes an upper insulating layer 225 and an upper gate electrode layer 230 disposed on the metal channel layer 260.

The substrate 210 may be a conductive substrate, and may include an integrated circuit (not shown) to transceive an electric signal. Compared to the electric device 100 of FIG. 1, the electric device 200 includes an upper insulating layer 225 and an upper gate electrode layer 230 disposed on the metal channel layer 260 instead of the gate electrode layer 130 disposed below the metal channel layer 160. Except this, components of the electric device 200 substantially correspond to components of the electric device 100. The repeating description thereof is thus omitted.

In some other embodiments, the electric device 200 may further include a lower gate electrode layer (not shown) disposed in the substrate 210 below the insulating layer 220 disposed between the source electrode layer 240 and the drain electrode layer 250. The lower gate electrode layer may have the substantially same operation at the substantially same position as the gate electrode layer 130 of FIG. 1. Accordingly, the electric device 200 may use the lower gate electrode layer and the upper gate electrode layer 230 to apply an electric field to the metal channel layer 260. As described above, when the electric device uses the metal channel layers 160 and 260, the conductivity of the electrons or holes moving through the metal channel layers 160 and 260 can be improved to suppress short channel effect occurring due to the reduction in size of the switching device and the leakage current increasing in a pause state from occurring.

Hereinafter, a method of manufacturing an electric device according to embodiments of the present disclosure will be described.

Figure 3A:
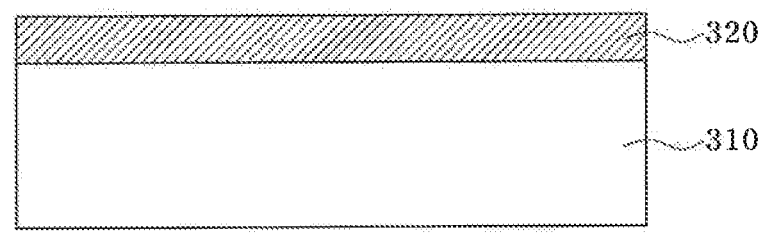
FIGS. 3A to 3C are cross-sectional views illustrating a method of forming a channel layer of an electric device according to an embodiment of the present disclosure.
Figure 3B:
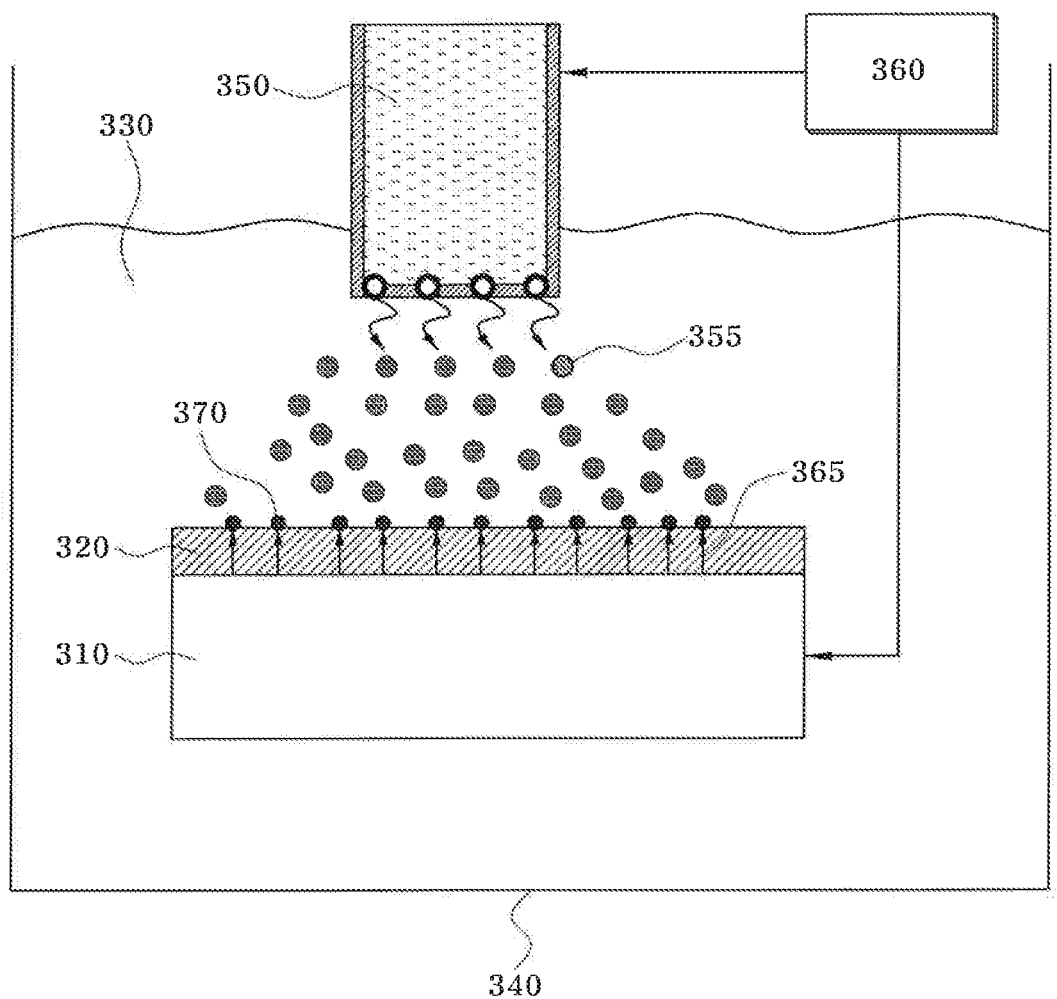
Figure 3C:
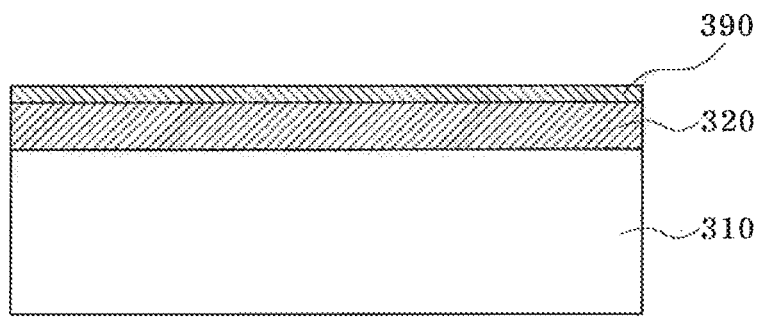

FIGS. 3A to 3C are cross-sectional views illustrating a method of forming a channel layer of the electric device according to an embodiment of the present disclosure. Referring to FIG. 3A, a conductive substrate 310 having an insulating layer 320 on the substrate is provided. The conductive substrate 310 may be, for example, an n-type or p-type doped semiconductor substrate, a metal substrate, a conductive metal oxide, or conductive polymer substrate. Alternatively, the conductive substrate 310 may be a substrate having a local conductivity by forming a conductive pattern in a portion of an insulating substrate or a semiconductor substrate. The semiconductor substrate may be, for example, Si, Ge, GaAs, InP, and so forth. The insulating substrate may be, for example, a silicon oxide, an aluminum oxide, a diamond, and so forth. The conductive substrate 310 may include an integrated circuit (not shown) to transceive an electric signal.

According to an embodiment, the insulating layer 320 may be formed by thermally oxidizing the conductive substrate 310. The insulating layer 320 may be formed of a silicon oxide film, a silicon nitride oxide film, a silicon nitride film, a hafnium oxide film, a tantalum oxide film, a titanium oxide film, or an aluminum oxide film. For example, when the conductive substrate 310 is formed of a material such as silicon, the doped silicon may be thermally oxidized to form a silicon oxide thin film on the conductive substrate 310. Alternatively, when the conductive substrate is a metal substrate, the metal substrate may be thermally oxidized to form the metal oxide film. According to other embodiments, the insulating layer 320 may be formed by carrying out a deposition method such as a chemical vapor deposition method, a sputtering is method, an atom-layer deposition method, a thermal evaporation method, or an electron beam evaporation method. The insulating layer 320 may act as a gate oxide film of the switching device. The insulating layer 320 may be formed to have a thickness of 10 Å to 200 Å, for example.

Referring to FIG. 3B, the conductive substrate 310 and the metal 350 to be plated are used as respective electrodes to carry out electroplating within the electrolyte solution 330. The conductive substrate 310 having the insulating layer 320 on the substrate is immersed into a vessel 340 including the electrolyte solution 330, and the electroplating is carried out to form a metal channel layer on the insulating layer 320. For example, the metal 350 may be gold, silver, platinum, aluminum, lead, hafnium, tantalum, titanium, copper, tin, or palladium. The electrolyte solution 330 may include ions of the metal 350 to be plated. For example, when the metal 350 is Au, the electrolyte solution 330 may be a solution including $HAuCl_4$. Alternatively, when the metal 350 is silver (Ag), electrolyte solution 330 may be a solution including $AgNO_3$. Alternatively; when the metal 350 is platinum, the electrolyte solution 330 may be a solution including $H_2Pt(NO_2)_2SO_4$ or $H_2PtCl_6$. The electrolyte solution 330 may additionally include a surface active agent. The surface active agent may act to aid in deposition of the metal in a unit of atomic layer at the time of electroplating to be described later. The power source 360 may provide a voltage between the conductive substrate 310 and the metal 350 to be plated present within the electrolyte solution 330.

In an embodiment, a voltage may be applied so as to cause the metal 350 to have a positive polarity and the conductive substrate 310 to have a relatively negative polarity. In this case, atoms within the metal 350 in contact with the electrolyte solution 330 are oxidized to produce metal ions 355, and the metal ions 355 may be introduced into the electrolyte solution 330. The conductive substrate 310 may generate a tunneling current 365 passing through the insulating layer 320 in response to the voltage applied from the power source 360. The tunneling current 365 may be generated by causing the electrons having the charges to pass through the insulating layer 320 in a tunneling conduction manner. For example, when the insulating layer 320 is formed to have a thickness of 10 Å to 200 Å, the electrons may pass through the insulating layer 320 to be conductive in a direct tunneling manner or a Fowler-Nordheim tunneling manner in proportion to the magnitude of the voltage applied to the conductive substrate 310.

The electrons of the tunneling current 365 that have passed through the insulating layer 320 from the conductive substrate 310 may be bonded with metal ions 355 on the surface of the insulating layer 320 within the electrolyte solution 330. The metal ions 355 may be boned with the electrons to be reduced to metal atoms 370 on the insulating layer 320. The reduced metal atoms 370 may be stacked on the insulating layer 320. In some embodiments, the electrolyte solution 330 may include a surface active agent. For example, the surface active agent may act on the surface of the insulating layer 320 or the interface of the metal atoms 370 reduced at the time of electroplating to remove foreign materials on the surface of the insulating layer 320 and to cause the reduced metal atoms 370 to be stacked on the insulating layer 320 on a to monolayer basis. Various known materials to be determined in accordance with kinds of the metal atoms 370 and the insulating layer 320 may be applied as the surface active agent.

In some embodiments, before carrying out the electroplating described with reference to FIG. 3B, a thiol-process may be performed on the insulating layer 320. The thiol-process means that a thiol is provided on the insulating layer 320. The thiol is a kind of an organic sulfide and is a compound in which hydrogen atoms of an aliphatic hydrocarbon are substituted with a mercapto group. The thiol may be indicated as a general formula RSH (R may be an alkyl group). The thiol disposed on the insulating layer 320 may increase a bonding strength between the insulating layer 320 and the metal atoms 370 to be plated on the insulating layer 320 in the subsequent electroplating process. Accordingly, an interface bonding strength between the insulating layer 320 and the metal channel layer to be formed from the plated metal atoms 370 can be enhanced. For example, when the metal to be plated is gold, the thiol-process may be carried out using a material such as 3-mercaptopropyltrimethoxysilane (MPTS).

Referring to FIG. 3C, the metal atoms 370 stacked on the insulating layer 320 through the electroplating described above form a metal channel layer 390. The metal channel layer 390 may include at least one layer of a metal atom layer, for example, and may have a thickness of about 5 Å or more. According to an example in which the metal channel layer 390 is applied to the electric device, the metal channel layer may have a thickness of 10 Å to 100 Å, and may include several to tens of lay of the metal atom layer. For example, when Au is used as the metal 350 and the doped silicon substrate is used as the conductive substrate 310, 5V may be applied to the Au electrode and a ground voltage (e.g., 0V) may be applied to the doped silicon substrate to form a metal channel layer including a gold atom layer on the silicon oxide film on the doped silicon substrate.

As described above, the electroplating method using the tunneling current according to an embodiment of the present disclosure may be applied to reliably form is several to tens of the thin metal channel layer in a unit of atomic layer on the insulating layer. When the metal channel layer is applied within the switching device, the metal channel layer may cause a depletion, accumulation, or inversion phenomenon of electrons or holes in response to the magnitude of the voltage to be applied.

Figure 4A:
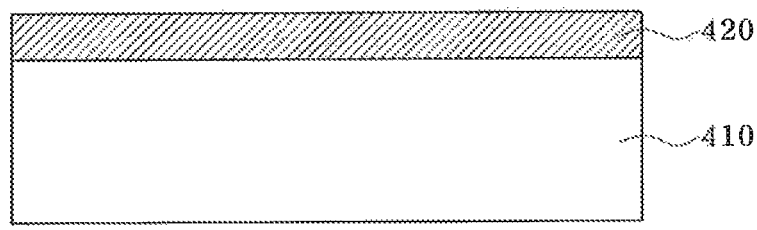
FIGS. 4A to 4F are cross-sectional views illustrating a method of manufacturing an electric device according to an embodiment of the present disclosure.

FIGS. 4A to 4F are cross-sectional views illustrating a method of manufacturing an electric device according to an embodiment of the present disclosure. Referring to FIG. 4A, an insulating layer 420 is formed on a conductive substrate 410. For example, the conductive substrate 410 may be an n-type or p-type doped semiconductor substrate, a metal substrate, a conductive metal oxide, or a conductive polymer substrate. Alternatively, the conductive substrate 410 may be a substrate having a local conductivity by forming a conductive pattern in a portion of the semiconductor substrate or the insulating substrate. The semiconductor substrate may be Si, Ge, GaAs, InP, and so forth, for example. The insulating layer may be a silicon oxide, an aluminum oxide, a diamond, and so forth, for example. The conductive substrate 410 may include an integrated circuit (not shown) within the substrate to transceive an electric signal.

According to an embodiment, the insulating layer 420 may be formed by thermal oxidation. The insulating layer 420 may be formed of a silicon oxide film, a silicon nitride oxide film, a silicon nitride film, a hafnium oxide film, a tantalum oxide film, a titanium oxide film, or an aluminum oxide film. For example, when the conductive substrate 410 is formed of a material such as silicon, the doped silicon may be thermally oxidized to form the silicon oxide thin film on the conductive substrate 410. Alternatively, when the conductive substrate is a metal substrate, the metal substrate may be thermally oxidized to form a metal oxide film. According to other is embodiments, the insulating layer 420 may be formed by depositing an insulating material on the conductive substrate 410 with a chemical vapor deposition method, a sputtering method, an atom-layer deposition method, a thermal evaporation method, or an electron beam evaporation method. The insulating layer 420 may be applied as a gate oxide film of the switching device and may be formed to have a thickness of 10 Å to 200 Å.

Figure 4B:
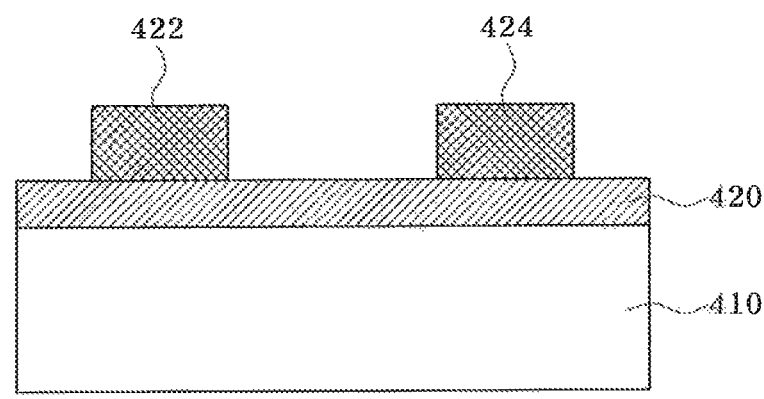

Referring to FIG. 4B, a source electrode layer 422 and a drain electrode layer 424 are formed to be spaced from each other on the insulating layer 420. The source electrode layer 422 and the drain electrode layer 424 may be formed of a conductive pattern. For example, the source electrode layer 422 and the drain electrode layer 424 may be formed by forming a conductive thin film such as a doped semiconductor, a metal, a metal suicide, or a conductive metal oxide on the insulating layer 420 and patterning the conductive thin film. According to an embodiment, for example, the conductive thin film may be formed by a process such as a chemical vapor deposition method, a sputtering method, an electron beam evaporation method, or a thermal evaporation method. The conductive thin film may then be patterned by known photolithography and etching processes to form the source electrode layer 422 and the drain electrode layer 424.

Figure 4C:
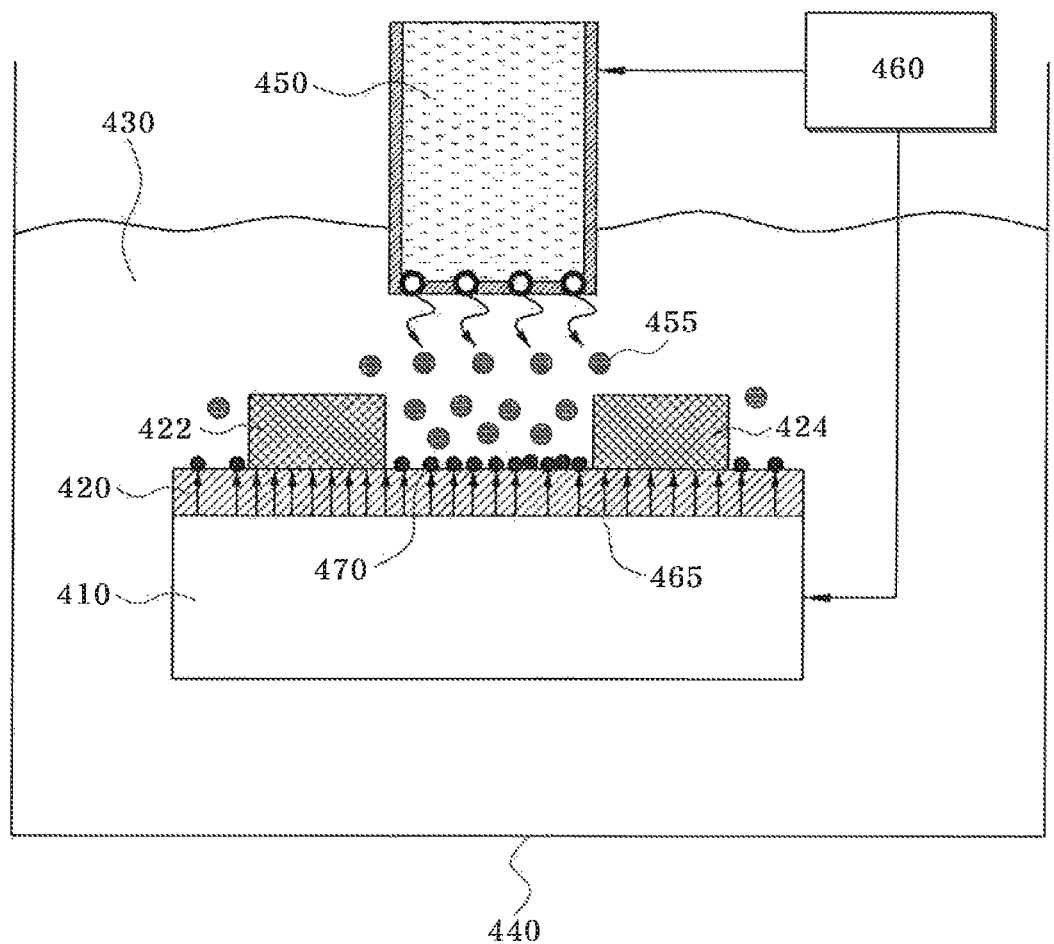

Referring to FIG. 4C, the conductive substrate 410 including the insulating layer 420, the source electrode layer 422, and the drain electrode layer 424 is immersed into an electrolyte solution 430. The conductive substrate 410 and the metal 450 to be platted are used as respective electrodes to carry out electroplating. The conductive substrate 410 is immersed into a vessel 440 including the electrolyte solution 430. The electrolyte solution 430 may include ions of a metal 450 to be plated. The metal 450 may be gold, silver, platinum, aluminum, lead, hafnium, tantalum, titanium, copper, tin, or palladium, for example. For example, when the metal 450 is Au, the electrolyte solution 430 may be a solution including $HAuCl_4$. Alternatively, when the metal 450 is Ag, the electrolyte solution 430 may be a solution including $AgNO_3$. Alternatively, when the metal 450 is platinum, the electrolyte solution 430 may be a solution including $H_2Pt(NO_2)_2SO_4$ or $H_2PtCl_6$. The electrolyte solution 430 may additionally include a surface active agent. For example, the surface active agent may act on the surface of the insulating layer 420 or the interface of metal atoms 470 reduced at the time of electroplating to remove foreign materials on the surface of the insulating layer 420 and to cause the reduced metal atoms 470 to be stacked on the insulating layer 420 on a monolayer basis.

A power source 460 may be used to provide a voltage between the conductive substrate 410 and the metal 450 to be plated present within the electrolyte solution 430 to carry out electroplating. In one embodiment, a positive voltage may be applied to the metal 450, and a negative voltage may be applied to the conductive substrate 410 or the conductive substrate may remain in a ground state. Accordingly, atoms of the metal 450 in contact with the electrolyte solution 430 may be oxidized to generate metal ions 455, and the metal ions 455 may be introduced into the electrolyte solution 430. The conductive substrate 410 may cause a tunneling current 465 passing through the insulating layer 420 to occur in response to the voltage applied from the power source 460. The tunneling current 465 may be generated by causing electrons having charges to pass through the insulating layer 420 in a tunneling conduction manner. For example, when the insulating layer 420 is formed to have a thickness of 10 Å to 200 Å, the electrons may pass through the insulating layer 420 in a direct tunneling manner or a Fowler-Nordheim tunneling manner to be conductive in proportion to the magnitude of the voltage to be applied to the conductive substrate 410.

The electrons of the tunneling current 465 that have passed through the insulating layer 420 from the conductive substrate 410 may be bonded with the metal ions 455 on the surface of the insulating layer 420 within the electrolyte solution 430. The metal ions 455 may be bonded with the electrons to be reduced to the metal atoms 470 on the insulating layer 420. The reduced metal atoms 470 may be stacked on the insulating layer 420. Although not shown, some of the electrons of the tunneling current 465 that have passed through the insulating layer 420 from the conductive substrate 410 may reach the source electrode layer 422 or the drain electrode layer 424. In this case, a predetermined voltage may be externally applied to the source electrode layer 422 and the drain electrode layer 424, so that elections that do not participating in the reduction reaction of the metal ions 455 may be discharged outside from the conductive substrate 410.

According to an embodiment, as described above, the conductive substrate 410 may have a local conductivity by forming a conductive pattern in a portion of the insulating substrate or the semiconductor substrate. As shown in FIG. 4C, the conductive pattern may be present in the conductive substrate 410 below the insulating layer 420 corresponding to a space between the source electrode layer 422 and the drain electrode layer 424. In this case, the electrons may be provided in the space between the source electrode layer 422 and the drain electrode layer 424 by the tunneling current, and the metal ions 455 may be reduced to the metal atoms 470 in the space on the insulating layer 420.

Figure 4D:
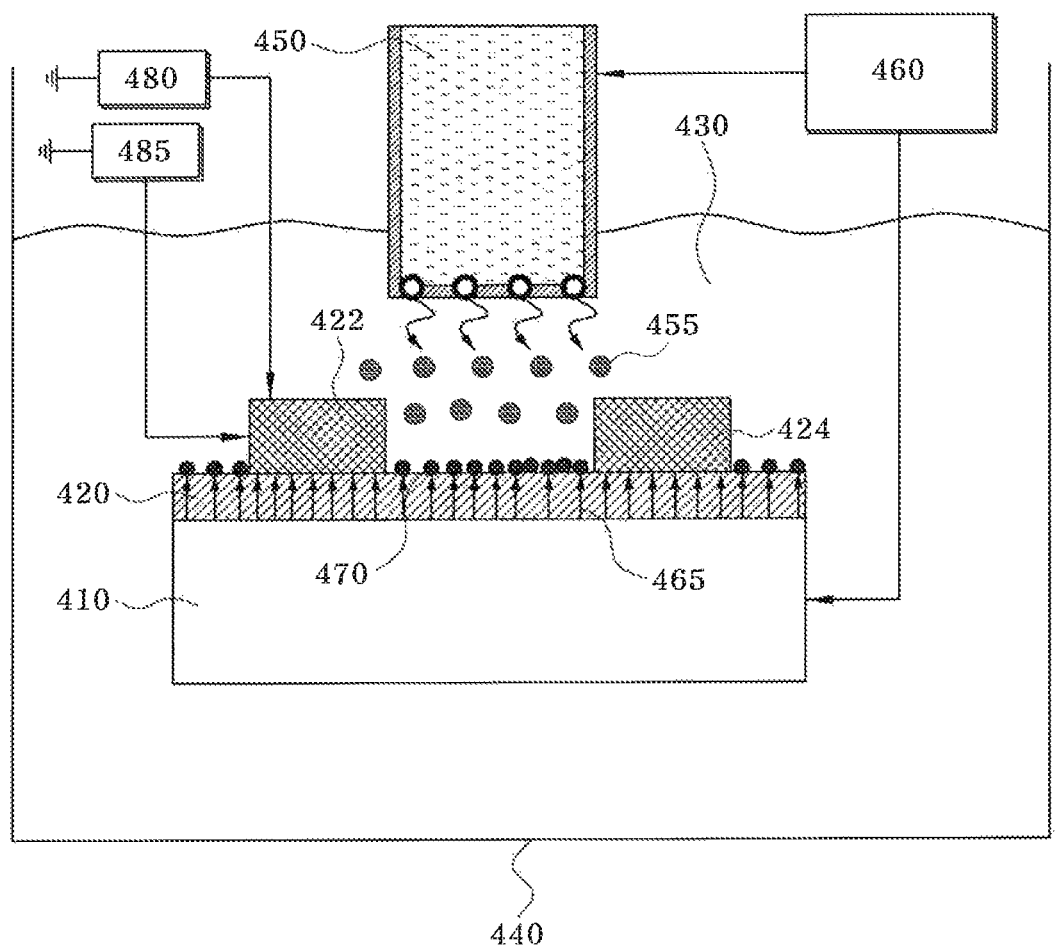

FIG. 4D is a cross-sectional view illustrating an electroplating method is according to another embodiment of the present disclosure. As shown in FIG. 4D, the conductive substrate 410 including the insulating layer 420, the source electrode layer 422 and the drain electrode layer 424 is immersed into the vessel 440 including the electrolyte solution 430. The power source 460 may be used to provide a voltage between the conductive substrate 410 and the metal 450 to be plated present within the electrolyte solution 430, thereby carrying out the electroplating. In an embodiment, a positive voltage may be applied to the metal 450, and a negative voltage may be applied to the conductive substrate 410, or the conductive substrate may remain in a ground state.

The power source 480 may be used to apply a voltage between the source electrode layer 422 and the drain electrode layer 424, and an instrument 485 may be used to measure a current flowing between the source electrode layer 422 and the drain electrode layer 424. While the electroplating is carried out, the metal atoms 470 reduced from the metal ions 455 are stacked on the insulating layer 420 between the source electrode layer 422 and the drain electrode layer 424. The stacked metal atoms 470 may form a metal channel layer between the source electrode layer 422 and the drain electrode layer 424. When a current not less than a predetermined threshold current value is measured by the instrument 485, it can be expected that a metal channel layer be formed between the source electrode layer 422 and the drain electrode layer 424. In addition, a thickness of the metal channel layer can be predicted based on the magnitude of the measured current.

When the metal channel layer is connected to the source electrode layer 422 or the drain electrode layer 424, electrons introduced from the substrate by the tunneling current into the metal channel layer move to the source electrode layer 422 or the drain electrode layer 424 and then not be introduced into the electrolyte solution but be discharged. Accordingly, additional reduction of metal ions does not occur on the metal channel layer connected to the source electrode layer 422 or the drain electrode layer 424. The electrons that have tunneled into the insulating layer in a region in which the connected metal channel layer is not present may be introduced into the electrolyte solution to form the metal layer. That is, a "Self-Limitation" phenomenon in which additional metal deposition on the connected metal channel layer is limited occurs. In this case, the electrons introduced into the metal atom stacked layer that is not connected to the source electrode layer 422 and the drain electrode layer 424 may be introduced into the electrolyte solution to cause the metal atoms to be stacked.

In an embodiment, when Au is used as the metal 450 to be plated and the doped silicon substrate is used as the conductive substrate 410, a ground voltage (e.g., 0V) is applied to the doped silicon substrate, and a voltage of 5V based on the ground voltage is applied to the gold. A voltage of 4.9V based on the ground voltage may be applied to the source electrode layer 422, and a voltage of 5V based on the ground voltage may be applied to the drain electrode layer 424. The gold atoms are then stacked on the insulating layer 420 between the source electrode layer 422 and the drain electrode layer 424 to form a metal channel layer. The source electrode layer 422 and the drain electrode layer 424 may keep a voltage similar to the voltage of 5V applied between the gold and the doped silicon substrate, so that the metal atoms may be prevented from being reduced on the source electrode layer 422 and the drain electrode layer 424. When a predetermined current value is measured by the instrument 485, the electroplating process may be completed to ensure a metal channel layer of the gold having a predetermined thickness.

According to some embodiments, the electrolyte solution 330 may include a surface active agent. For example, the surface active agent may act on the surface of the insulating layer 420 or the interface of the metal atoms 470 reduced at the time of electroplating to remove foreign materials on the surface of the insulating layer 420 and to cause the reduced metal atoms 470 to be stacked on the insulating layer 420 on a monolayer basis.

In some embodiments, before carrying out the electroplating process described with reference to FIG. 4C or 4D, a thiol-process may be carried out on the source electrode layer 422 and the drain electrode layer 424. The thiol-process means that a thiol is provided on the source electrode layer 422 and the drain electrode layer 424. The thiol is a kind of an organic sulfide and is a compound in which hydrogen atoms of an aliphatic hydrocarbon are substituted with a mercapto group. The thiol may be indicated as a general formula RSH (R may be an alkyl group). The thiol disposed on the source electrode layer 422 and the drain electrode layer 424 may suppress the metal atoms 470 from being attached on the source electrode layer 422 and the drain electrode layer 424 that are conductors in the subsequent electroplating process. For example, when the metal to be electroplated is gold, 11-thioundecanoic acid, HS—C10-COOH may be applied as the thiol.

In some other embodiments, before carrying out the electroplating process described with reference to FIG. 4C or 4D, a thiol-process may be carried out on the insulating layer 420. The thiol-process may increase a bonding strength between the insulating layer 420 and the metal atoms 470 to be plated on the insulating layer 420 in the subsequent electroplating process. The interface bonding strength between the insulating layer 420 and the metal channel layer to be formed from the plated metal atoms 470 can thus be enhanced. For example, when the metal to be plated is gold, the thiol-process may be carried out using a material such as MPTS.

Figure 4E:
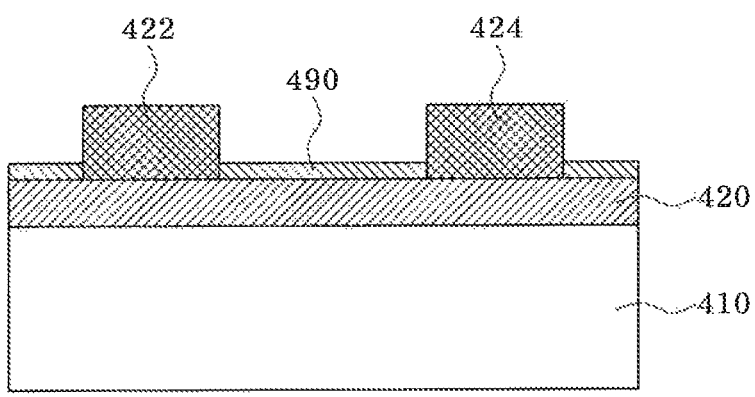

Referring to FIG. 4E, a metal channel layer 490 is formed on the insulating layer 420 by the electroplating method of FIG. 4C or 4D. For example, the metal channel layer 490 may include at least one layer of a metal atom layer, and may have a thickness of about 5 Å or more. According to an example in which the metal channel layer 490 is applied to the electric device, the metal channel layer may have a thickness of 10 Å to 100 Å, and may include several to tens of metal atom layers.

Figure 4F:
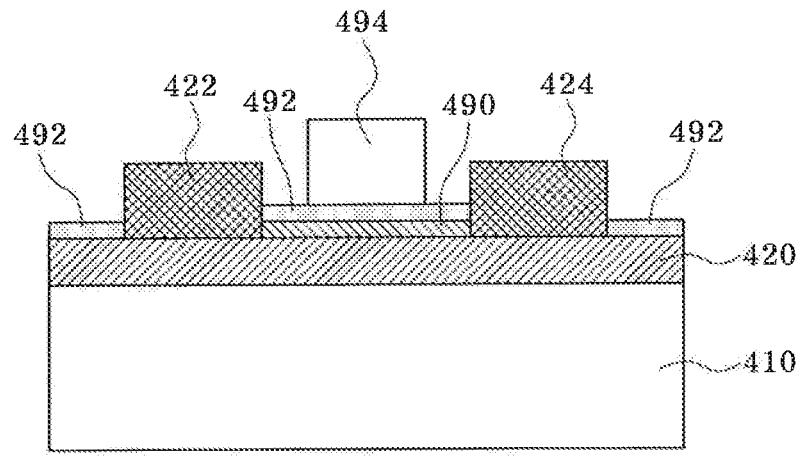

Referring to FIG. 4F, a gate dielectric film 492 and a gate electrode 494 are formed on the metal channel layer 490. The metal channel layer 490 of FIG. 4E may be additionally patterned. For example, photolithography and etching processes may be used to pattern the metal channel layer 490 having a shape and a function matching the channel layer of the electric device. An oxide film or a nitride film may then be formed as the gate dielectric film 492. The oxide film may include a silicon oxide, or a metal oxide such as a hafnium oxide, an aluminum oxide, a tantalum oxide, or a titanium oxide. The nitride film may include a silicon nitride, or a metal nitride such as an aluminum nitride, a tantalum nitride, or a titanium nitride. The gate dielectric film 492 may be formed by carrying out a chemical vapor deposition method, a sputtering method, an atom-layer deposition method, a thermal evaporation method, or an electron beam evaporation method. The gate dielectric film 492 may be formed to have a thickness of 10 Å to 200 Å.

The gate electrode 494 may be formed on the gate dielectric film 492. In the formation of the gate electrode 494, for example, a conductive thin film such as a doped semiconductor, a metal, a metal silicide, or a conductive metal oxide is formed on the gate dielectric film 492. According to an embodiment, the conductive thin film may be formed by a process such as a chemical vapor deposition method, a sputtering method, an electron beam evaporation method, or a thermal evaporation method. The conductive thin film may then be patterned by photolithography and etching processes to form the gate electrode 494. The gate electrode 494 may externally receive a predetermined gate voltage to form an electric field in the metal channel layer 490. The electric field formed in the metal channel layer 490 may cause depletion, accumulation, or inversion of charges to occur on the metal channel layer 490, thereby adjusting the flow of the conductive charges between the source electrode layer 422 and the drain electrode layer 424 through the metal channel layer 490.

Figure 5A:
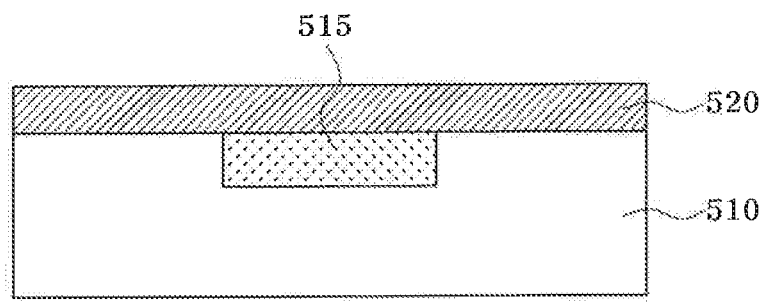
FIGS. 5A to 5C are cross-sectional views illustrating a method of manufacturing an electric device according to another embodiment of the present disclosure.
Figure 5B:
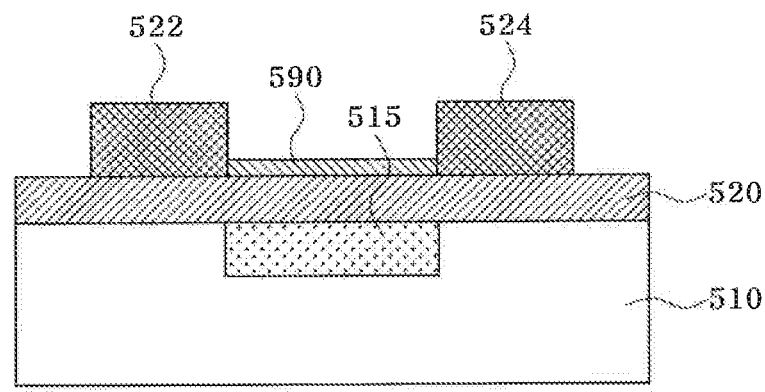
Figure 5C:
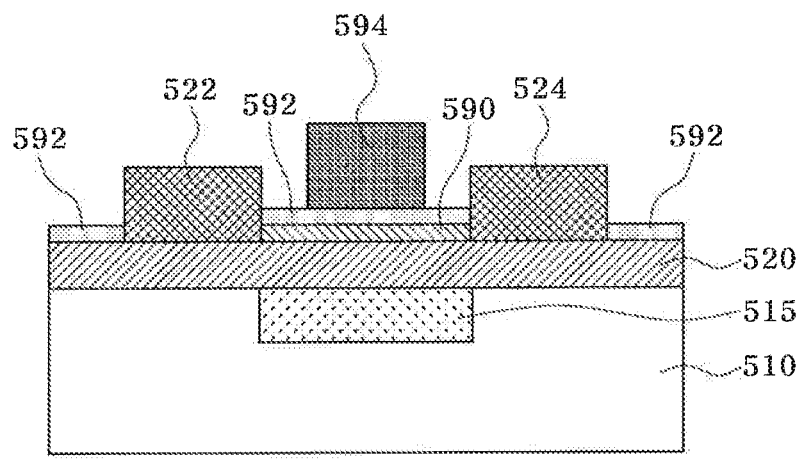

FIGS. 5A to 5C are views illustrating a method of manufacturing an electric device according to another embodiment of the present disclosure. Referring to FIG. 5A, a substrate 510 having an insulating layer 520 on the substrate is provided. A gate electrode layer 515 may be formed on the substrate 510. According to an embodiment, dopants may be injected into a portion of the substrate 510 by an ion injection method or a diffusion method, thereby forming a gate electrode layer 515 in the portion of the substrate 510. According to another embodiment, the substrate 510 may be etched by lithography and etching processes to form a predetermined contact pattern, and the contact pattern may be filled with a conductive material to form a gate electrode layer 515. For example, the gate electrode layer 515 may be formed from a doped semiconductor, a metal, a metal suicide, or a conductive metal oxide. An insulating layer 520 may be formed on the substrate 510 in which the gate electrode layer 515 is formed. The conductive substrate and the insulating layer are substantially same as the conductive substrate 410 and the insulating layer 420 described with reference to FIG. 4A except that the substrate 510 includes the gate electrode layer 515.

The substantially same processes as the embodiment described with reference to FIGS. 4B to 4D may then be carried out. As a result, as shown in FIG. 5B, a metal channel layer 590 may be formed on the insulating layer 520 between the source electrode layer 522 and the drain electrode layer 524. For example, the substantially same electroplating process as the electroplating process of the embodiment of FIG. 4C or 4D may be carried out, and a predetermined voltage may be applied between the gate electrode layer 515 and a metal to be plated. In this case, a tunneling current passing through the insulating layer 520 from the gate electrode layer 515 may be generated, so that the metal channel layer 590 may be formed on the insulating layer 520 above the gate electrode layer 515.

According to some embodiments, as shown in FIG. 5C, an upper gate dielectric film 592 and an upper gate electrode 594 may be additionally formed on the metal channel layer 590. The process of forming the upper gate dielectric film 592 and an upper gate electrode 594 is the substantially same as the process of forming the gate dielectric film 492 and the gate electrode 494 on the metal channel layer 490 in the embodiment described with reference to FIG. 4F, so that a repeating description thereof is omitted. The electric device having the gate electrode on and below the metal channel layer 590 may thus be formed.

As described above, the electroplating method using the tunneling current may be carried out to manufacture the electric device including the metal channel layer. The metal channel layer may cause depletion, accumulation, or inversion of electrons to occur in response to the magnitude of the gate voltage to be applied. By employing the metal channel layer, the conductivity of electrons or holes of the channel layer is good and the electric device having a relatively smaller leak current in a pause state can be formed in comparison with the related art.

Figure 6A:
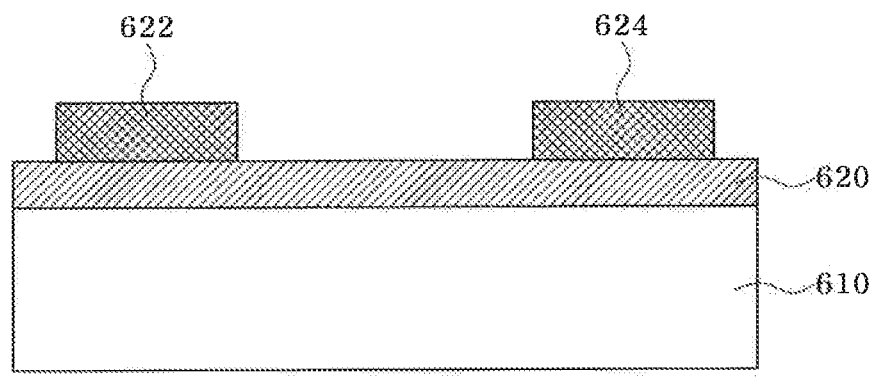
FIGS. 6A to 6G are cross-sectional views illustrating a method of manufacturing an electric device according to yet another embodiment of the present disclosure.

FIGS. 6A to 6G are cross-sectional views illustrating a method of manufacturing an electric device according to an embodiment of the present disclosure. Referring to FIG. 6A, a source electrode layer 622 and a drain electrode layer 624 are formed to be spaced from each other on a conductive substrate 610 having an insulating layer 620. The conductive substrate 610, the insulating layer 620, the source electrode layer 622, and the drain electrode layer 624 are the substantially same as the conductive substrate 410, the insulating layer 420, the source electrode layer 422, and the drain electrode layer 424 described with reference to FIGS. 4A to 4E, and may be formed by the substantially same processes as the processes described with reference to FIGS. 4A and 4B.

Figure 6B:
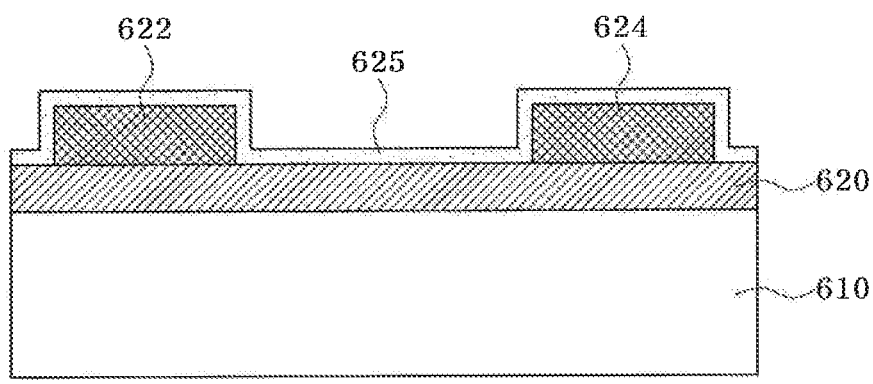

Referring to FIG. 6B, a base metal layer 625 is firmed on the conductive substrate 610 including the insulating layer 620, the source electrode layer 622, and the drain electrode layer 624. For example, the base metal layer 625 may be a conductive thin film formed from a doped semiconductor, a metal, a metal suicide, or a conductive metal oxide. For example, the base metal layer 625 may be formed from gold, silver, platinum, aluminum, lead, hafnium, tantalum, titanium, copper, tin, or palladium. For example, the base metal layer 625 may be formed of the same material as the source electrode layer 622 and the drain electrode layer 624. According to an embodiment, the base metal layer 625 may be formed by depositing the conductive thin film on the conductive substrate 610 using a process such as a chemical vapor deposition method, a sputtering method, an evaporation method, or a thermal evaporation method.

Figure 6C:
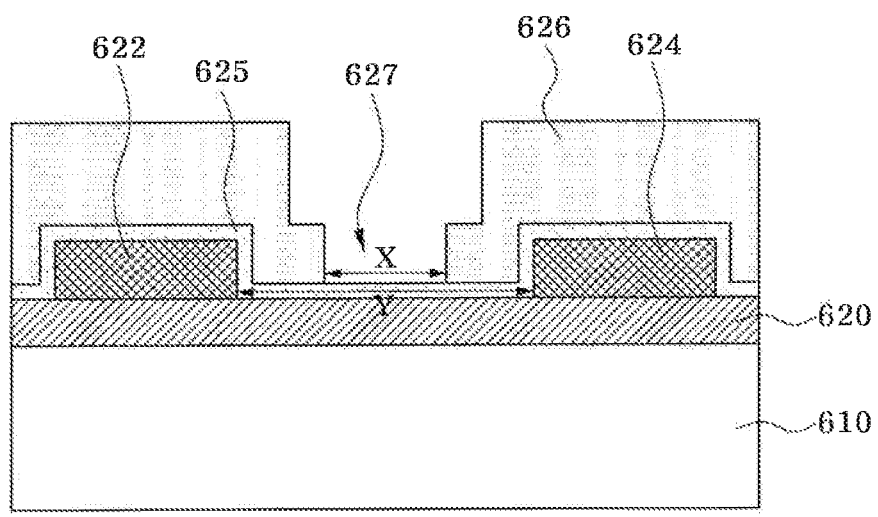

Referring to FIG. 6C, a photoresist is applied on the conductive substrate 610, and a lithography process is carried out to form a photoresist pattern 626 exposing a portion of the base metal layer 625. The photoresist pattern 626 may be formed by carrying out at least one lithography process, and may include a via hole 627 exposing a portion of the base metal layer 625. As shown in FIG. 6C, a lateral direction length X of the via hole 627 may be shorter than a length Y between the source electrode layer 622 and the drain electrode layer 624.

Figure 6D:
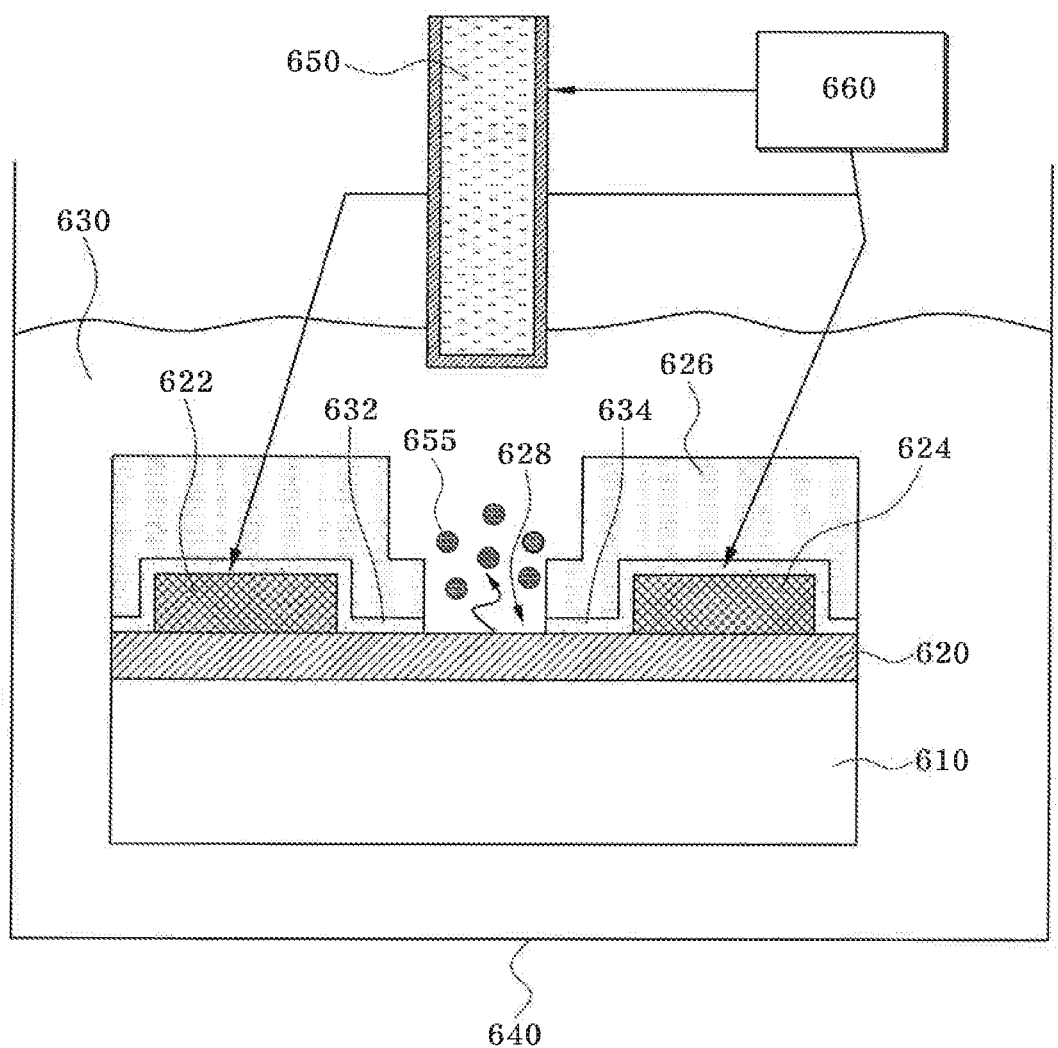

Referring to FIG. 6D, the portion of the base metal layer 625 exposed by the photoresist pattern 626 is removed to expose a portion of the insulating layer 620. According to an embodiment, the portion of the base metal layer 625 may be removed by an electrolysis method using the electrolyte solution 630. The conductive substrate 610 in which the photoresist pattern 626 is formed is provided with the electrolyte solution 630. For example, the method of providing the conductive substrate 610 with the electrolyte solution 630 may include a method of immersing the conductive substrate 610 into the electrolyte solution 630, a method of spraying the electrolyte solution 630 in the conductive substrate 610, and so forth. However, the method is not limited these examples and may employ various known methods. Hereinafter, for example, a method of immersing the conductive substrate 610 into the electrolyte solution 630 will be described with drawings.

The conductive substrate 610 is immersed into the vessel 640 including the electrolyte solution 630, and the source electrode layer 622 and the drain electrode layer 624 of the conductive substrate 610 are used as a positive electrode and an externally introduced conductor 650 is used as a negative electrode to electrolyze the electrolyte solution 630. For example, the conductor 650 may be a metal such as gold, silver, platinum, aluminum, lead, hafnium, tantalum, titanium, copper, tin, or palladium. However, the conductor is not limited thereto and may employ known electrode materials. By causing the metal of the base metal layer 625 to be metal ions 655 and the metal ions to be introduced into the electrolyte solution 630 in the electrolysis procedure, the portion of the base metal layer 625 may be removed. As a result, a contact pattern 628 and a source extension layer 632 and a drain extension layer 634 separated by the contact pattern 628 may be formed. The size of the contact pattern 628 may determine the length and width of the metal channel layer of the electric device to be described later. The source extension layer 632 and the drain extension layer 634 may surround the respective source electrode layer 622 and the drain electrode layer 624, and may extend from the respective source electrode layer 622 and the drain electrode layer 624 to face each other. The electrolysis method may prevent the lower insulating layer 620 from being damaged while the portion of the base metal layer 625 is removed. Accordingly, the insulating layer 620 exposed by the contact pattern 628 is not subjected to mechanical and electrical damages, and the metal channel layer formation process may be reliably carried out on the exposed insulating layer 620 as will be described later. That is, for example, the metal channel layer may be uniformly formed on the exposed insulating layer 620.

According to an embodiment, when the base metal layer 625 is formed of gold, the electrolyte solution 630 may be a solution including HCl. The conductive substrate 610 including the photoresist pattern 626 is immersed into the vessel 640 including the electrolyte solution 630 having HCl. The power source 660 may apply a negative voltage to the conductor 650 and a ground voltage (e.g., 0V) to the source electrode layer 622 and the drain electrode layer 624. In the electrolysis procedure of the electrolyte solution 630, the gold of the base metal layer 625 partially exposed by the photoresist pattern 626 is oxidized to be metal ions 655, and the metal ions are introduced into the electrolyte solution 630. The gold of the base metal layer 625 may be partially removed by the electrolysis described above, and the contact pattern 628 may be formed. When the contact pattern 628, the source extension layer 632, and the drain extension layer 634 are formed, the photoresist pattern 626 may be removed.

According to some other embodiments, removal of the base metal layer 625 partially exposed by the photoresist pattern 626 may be carried out by an etching process unlike the embodiment of FIG. 6D. The etching process may be dry etching, wet etching, or a combination thereof. In the etching process, a known etching solution or an etching gas applicable to the metal of the base metal layer 625 may be used. When the contact pattern 628, the source extension layer 632, and the drain extension layer 634 are formed by the etching process, the photoresist pattern 626 may be removed. The damage on the surface of the insulator in the etching process may be compensated through a subsequent thermal process.

Figure 6E:
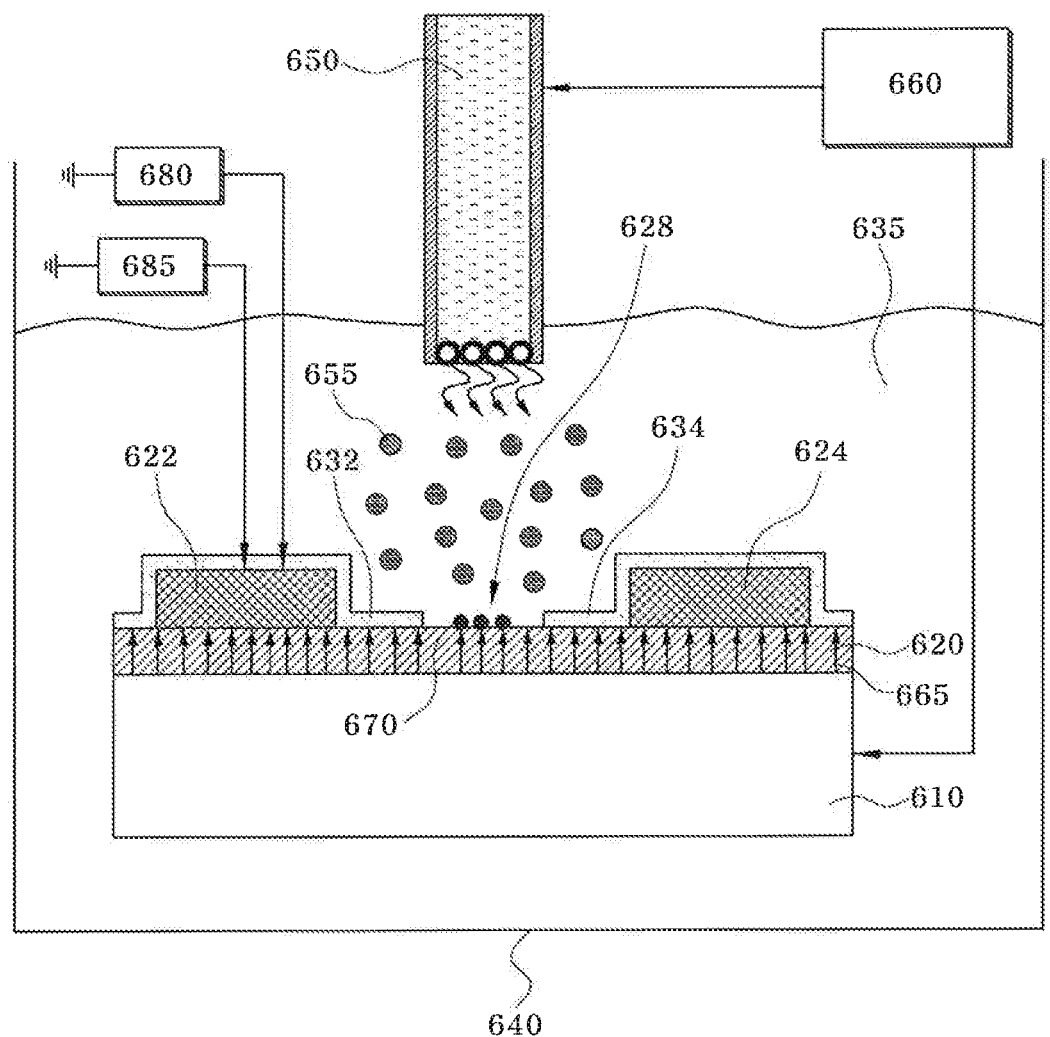

Referring to FIG. 6E, the conductive substrate 610 including the contact pattern 628 is immersed into the electrolyte solution 635. The conductive substrate 610 and the metal 650 to be plated are used as respective electrodes to carry out electroplating. The conductive substrate 610 is first immersed into the vessel 640 including the electrolyte solution 635. The electrolyte solution 635 may include ions of the metal 650 to be plated. For example, the metal 650 may be gold, silver, platinum, aluminum, lead, hafnium, tantalum, titanium, copper, tin, or palladium. For example, when the metal 625 is Au, the electrolyte solution 635 may be a solution including $HAuCl_4$. The electrolyte solution 635 may additionally include a surface active agent. The surface active agent may act to aid in deposition of the metal in a unit of atomic layer at the time of electroplating. The power source 660 may provide a voltage between the conductive substrate 610 and the metal 650 to be plated present within the electrolyte solution 635 to carry out electroplating. In an embodiment, a positive voltage may be applied to the metal 650, and a negative voltage may be applied to the conductive substrate 610, or the conductive substrate may remain in a ground state. The metal 650 may be oxidized to produce metal ions 656, and the metal ions 656 may be introduced into the electrolyte solution 635. The conductive substrate 610 may generate a tunneling current 665 passing through the insulating layer 620 in response to the voltage applied from the power source 660. The tunneling current 665 may be generated by causing electrons having charges to pass through the insulating layer 620 in a tunneling conduction manner. For example, when the insulating layer 620 is formed to have a thickness of 10 Å to 200 Å, the electrons may pass through the insulating layer 620 to be conductive in a direct tunneling manner or a Fowler-Nordheim tunneling manner in proportion to the magnitude of the voltage to be applied to the conductive substrate 610.

Some of the electrons of the tunneling current 665 that have passed through the insulating layer 620 from the conductive substrate 610 may reach the surface of the insulating layer 620 exposed by the contact pattern 628. The some electrons of the tunneling current 665 may be bonded with the metal ions within the electrolyte solution to 635 on the surface of the insulating layer 620 exposed by the contact pattern 628. The metal ions 656 may be bonded with the some electrons to be reduced to the metal ions 670 on the insulating layer 620 exposed by the contact pattern 628. The reduced metal ions 670 may be stacked on the exposed insulating layer 620 to form a metal channel layer. Although not shown, others of the electrons of the tunneling current 665 that is have passed through the insulating layer 620 from the conductive substrate 610 may reach the source electrode layer 622, the source extension layer 632, the drain electrode layer 624, and the drain extension layer 634. In this case, a predetermined voltage may be externally applied to the source electrode layer 622, the source extension layer 632, the drain electrode layer 624, and the drain extension layer 634, so that electrons that do not participate in the reduction reaction of the metal ions 656 may be discharged outside from the conductive substrate 610.

According to an embodiment, the substantially same method as the method described with reference to FIG. 4D may be applied to apply a voltage between the source electrode layer 522 and the drain electrode layer 524 while the electroplating is carried out. While the electroplating is carried out, the power source 680 may be used to apply a voltage between the source electrode layer 622 and the drain electrode layer 624 and an instrument 685 may be used to measure a current flowing between the source electrode layer 622 and the drain electrode layer 624. By measuring the current, whether the electroplating process is completed and the thickness of the formed metal channel layer may be predicted. For example, when Au is used as the metal 650 to be plated and the doped silicon substrate is used as the conductive substrate 610, a ground voltage (e.g., 0V) is applied to the doped silicon substrate, and a voltage of 5V based on the ground voltage is applied to Au. A voltage of 4.9V based on the ground voltage may be applied to the source electrode layer 622 and a voltage of 5V based on the ground voltage may be applied to the drain electrode layer 624. In this case, a pad for applying a voltage (not shown) may be separately provided. The pad is electrically connected to the source electrode 622, the drain electrode layer 624 and the doped silicon substrate, and is positioned in the doped silicon substrate. Au atoms are then is stacked on the insulating layer 620 exposed by the contact pattern 628 between the source extension layer 632 and the drain extension layer 634 to form a metal channel layer of Au. The source electrode layer 622 and the drain electrode layer 624 keep the voltage similar to the voltage of 5V applied between Au and the doped silicon substrate, so that the Au atoms can be prevented from being reduced on the source electrode layer 622, the source extension layer 632, the drain electrode layer 624, and the drain extension layer 634. When a predetermined current value is measured by the instrument 685, the electroplating process may be completed to ensure the metal channel layer of Au having a predetermined thickness.

According to some embodiments, the electrolyte solution 635 may include a surface active agent. For example, the surface active agent may act on the surface of the insulating layer 620 or the interface of the metal atoms 670 reduced at the time of electroplating to remove foreign materials on the surface of the insulating layer 620 and to cause the educed metal atoms 670 to be stacked on the insulating layer 620 on a monolayer basis.

According to some other embodiments, before carrying out the electroplating described with reference to FIG. 6E, a thiol-process may be carried out on the insulating layer 620. The thiol-process may increase an bonding strength between the insulating layer 620 and the metal atoms 670 to be plated on the insulating layer 620 in the subsequent electroplating process. Accordingly, the interface bonding strength between the insulating layer 620 and the metal channel layer to be formed from the plated metal atoms 670 may be enhanced. For example, when the plated metal is Au, the thiol-process may be carried out using a material such as MPTS.

Figure 6F:
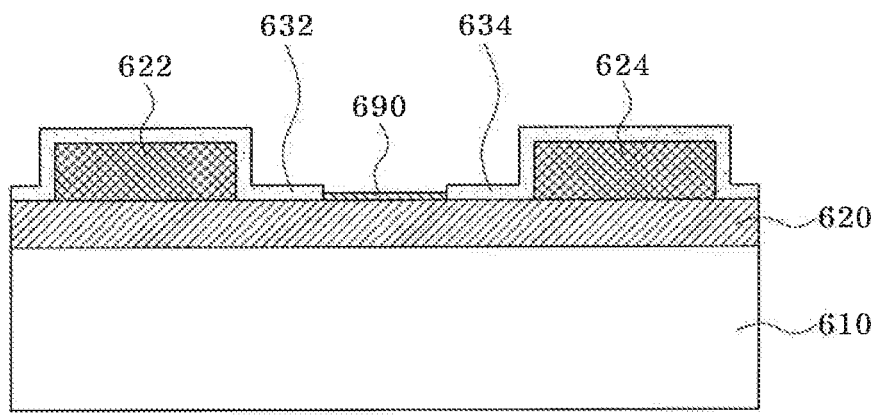
Figure 6G:
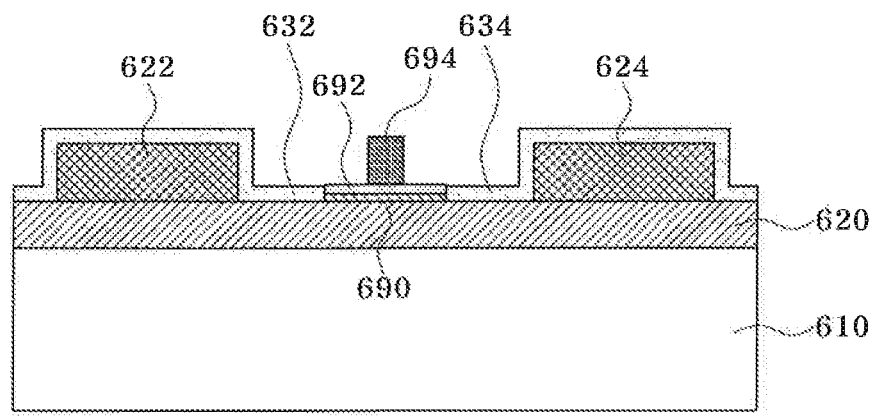

FIG. 6F illustrates a metal channel layer 690 formed on the insulating layer 620 between the source extension layer 632 and the drain extension layer 634 as a result of the electroplating. Referring to FIG. 6G, a gate dielectric film 692 and a gate electrode 694 are formed on the metal channel layer 690. A method of forming the gate dielectric film 692 and the gate electrode 694 is the substantially same as the process of forming the gate dielectric film 492 and the gate electrode 494 on the metal channel layer 490 in the embodiment described with reference to FIG. 4F, so that a repeating description thereof is omitted.

As described above, the electroplating method using the tunneling current may be carried out to form the metal channel layer on the insulator. The metal channel layer may cause depletion, accumulation, or inversion of electrons to occur in response to the magnitude of the gate voltage to be applied, and can thus be applied as a channel layer of the switching device.

Figure 7A:
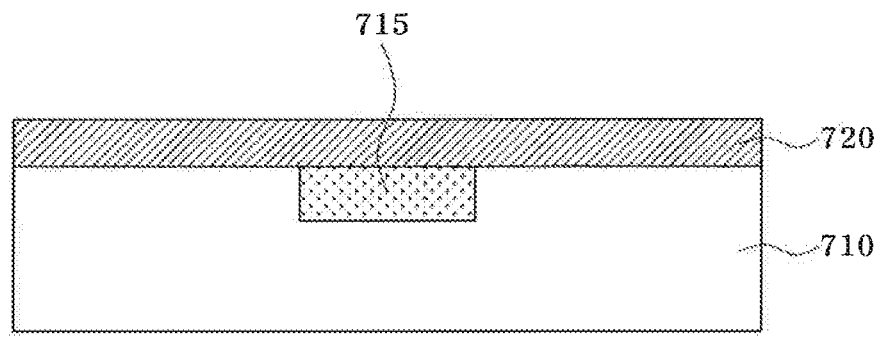
FIGS. 7A to 7C are cross-sectional views illustrating a method of manufacturing an electric device according to still yet another embodiment of the present disclosure.
Figure 7B:
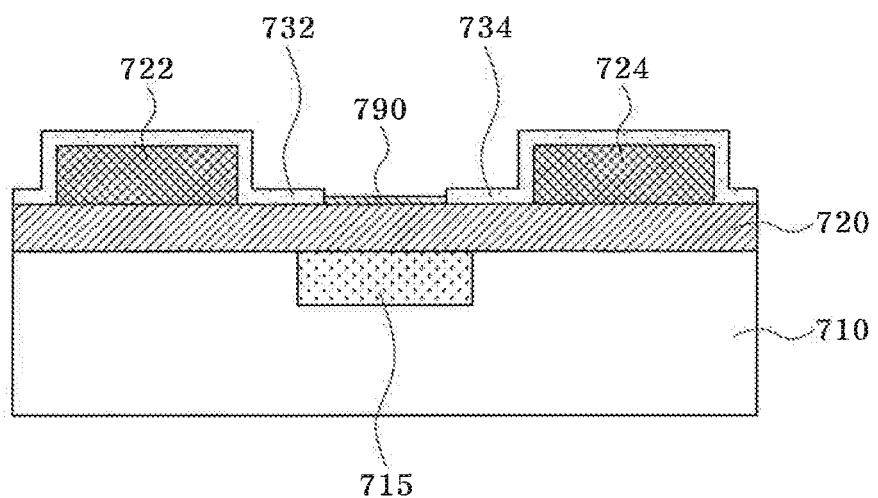
Figure 7C:
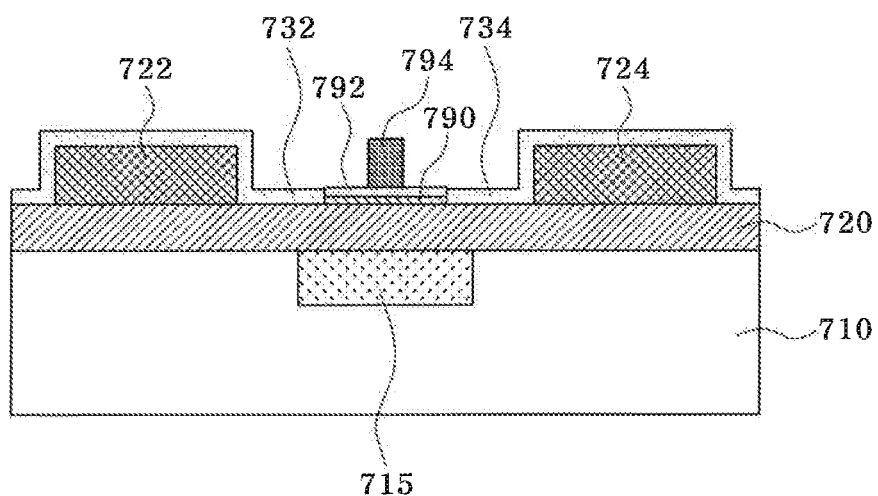

FIGS. 7A to 7C are views illustrating a method of manufacturing an electric device according to another embodiment of the present disclosure. Referring to FIG. 7A, a substrate 710 having an insulating layer 720 on the substrate is provided. A gate electrode layer 715 may be formed in the substrate 710. According to an embodiment, dopants may be injected into a portion of the substrate 710 by an ion injection method or a diffusion method to form the gate electrode layer 715 in the portion of the substrate 710. According to another embodiment, the substrate 710 may be etched by lithography and etching processes to form a predetermined contact pattern, and the contact pattern may be filled with a conductive material to form the gate electrode layer 715. For example, the gate electrode 715 may be formed from a doped semiconductor, a metal, a metal silicide, or a conductive metal oxide. The insulating layer 720 may be formed on the substrate 710 in which the gate electrode layer 715 is formed. The conductive substrate and the insulating layer are the substantially same as the conductive substrate 410 and the insulating layer 420 described with reference to FIG. 6A except that the substrate 710 includes the gate electrode layer 715.

The substantially same processes as the processes in the embodiment described with reference to FIGS. 6B to 6E may then be carried out. As a result, as shown in FIG. 713, a metal channel layer 790 may be formed on the insulating layer 720 between a source extension layer 732 and a drain extension layer 734. For example, the substantially same electroplating process as the electroplating process of the embodiment of FIG. 6E may be carried out, and a predetermined voltage may be applied between the gate electrode layer 715 and a metal to be plated. In this case, a tunneling current passing through the insulating layer 720 from the gate electrode layer 715 may be generated, so that the metal channel layer 790 may be formed on the insulating layer 720 above the gate electrode 715.

According to some embodiments, as shown in FIG. 7C, an upper gate dielectric film 792 and an upper gate electrode 794 may be additionally formed on the metal channel layer 790. The process of forming the upper gate dielectric film 792 and the upper gate electrode 794 is the substantially same as the process of forming the gate dielectric film 692 and the gate electrode 694 on the metal channel layer 690 in the embodiment described with reference to FIG. 6G, so that the repeating description thereof is omitted. The electric device having the gate electrode on and below the metal channel layer 790 can thus be formed.

As described above, the electroplating method using the tunneling current may be carried out to manufacture the electric device including the metal channel layer. The metal channel layer may have about several to tens of metal atom layers, and may cause depletion, accumulation, or inversion of electrons to occur in response to the magnitude of the gate voltage to be applied. The electric device having a good conductivity of charges through the metal channel layer and a relatively small leak current in a standby state can be formed in comparison with the related art.

In the method of manufacturing the electric device according to the embodiments described with reference to FIGS. 6A to 6G and 7A to 7C, at the time of forming the metal channel layer having a predetermined length and a predetermined width, a metal base layer having a sufficient length and a sufficient width is first formed and a portion of the metal base layer is removed, so that a contact pattern corresponding to a portion in which the metal channel layer is to be formed may be formed beforehand. The metal channel layer may be formed on an insulator within the contact pattern by an electroplating method. The thickness, length, and width of the metal channel layer can thus be readily controlled when the metal channel layer having a relatively small size is formed. In addition, when the portion of the metal base layer is removed, the lower insulating layer can be prevented from being damaged when the electroplating method is employed, so that the metal channel layer can be uniformly formed in the subsequent electroplating method.

The foregoing is illustrative of the present disclosure and is not to be construed as limiting thereof. Although numerous embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A method of forming a channel layer of an electric device, comprising:
   (a) providing a conductive substrate having an insulating layer formed on a surface of the substrate;
   (b) immersing the conductive substrate and a metal to be plated into an electrolyte solution; and
   (c) applying a voltage to generate a tunneling current caused by electrons passing through the insulating layer from the conductive substrate using the conductive substrate and the metal as respective electrodes, and bonding ions of the metal within the electrolyte solution with the electrons that have tunneled through the insulating layer to form a metal channel layer on the insulating layer,
   after (a) providing a conductive substrate with an insulating layer, forming at least one electrode layer on the insulating layer;
   wherein in (c) bonding the ions of the metal with the electrons, when the metal channel layer is connected to the at least one electrode layer, bonding the ions of the metal with the electrons is stopped at the metal channel layer.

2. The method according to claim 1, wherein the conductive substrate is made by forming a conductive pattern within a semiconductor substrate or an insulating substrate.

3. The method according to claim 1, wherein the electrolyte solution includes the ions of the metal to be plated.

4. The method according to claim 1, wherein (b) immersing the conductive substrate and the metal includes applying a voltage so that the metal has a positive polarity and the conductive substrate has a negative polarity within the electrolyte solution.

5. The method according to claim 1, further comprising:
   prior to (b) immersing the conductive substrate and the metal, carrying out a thiol-process on the insulating layer so that a bonding strength between the insulating layer and the metal produced in (b) immersing the conductive substrate and the metal is increased.

6. A method of manufacturing an electric device, comprising:
   (a) forming an insulating layer on a conductive substrate;
   (b) forming a source electrode layer and a drain electrode layer to be spaced from each other on the insulating layer;
   (c) immersing the conductive substrate including the insulating layer, the source electrode layer, and the drain electrode layer into an electrolyte solution; and
   (d) carrying out electroplating using the conductive substrate and a metal to be plated as respective electrodes,
   wherein electrons of a tunneling current passing through the insulating layer from the conductive substrate are bonded with ions of the metal within the electrolyte solution to form a metal channel layer on the insulating layer between the source electrode layer and the drain electrode layer,
   wherein (d) carrying out the electroplating includes applying a voltage between the source electrode layer and the drain electrode layer and measuring a current flowing between the source electrode layer and the drain electrode layer to determine whether the electroplating forming the metal channel layer is completed.

7. The method according to claim 6, wherein the conductive substrate is made by forming a conductive pattern within a semiconductor substrate or an insulating substrate, and wherein the conductive pattern is a lower gate electrode layer, and the insulating layer is a lower gate dielectric film.

8. The method according to claim 6, wherein the source electrode layer and the drain electrode layer are formed by depositing a metal film on the insulating layer and patterning the metal thin film.

9. The method according to claim 6, further comprising:
   (e) forming an upper gate dielectric film on the metal channel layer; and
   (f) forming an upper gate electrode layer on the upper gate dielectric film.

10. The method according to claim 6, wherein in (d) carrying out the electroplating, the electrolyte solution includes a surface active agent, and the surface active agent causes the metal channel layer to be formed on the insulating layer in a unit of atomic layer.

11. The method according to claim 6, further comprising:
    prior to (d) carrying out the electroplating, carrying out a thiol-process on the insulating layer so that a bonding strength between the insulating layer and the metal produced in (d) carrying out the electroplating is increased.

12. The method according to claim 6, further comprising:
    prior to (d) carrying out the electroplating, carrying out a thiol-process on the source electrode layer and the drain electrode layer so that the metal produced in (d) carrying out the electroplating is suppressed from being attached on the source electrode layer and the drain electrode layer.

13. A method of manufacturing an electric device, comprising:
    (a) forming an insulating layer on a conductive substrate;
    (b) forming a source electrode layer and a drain electrode layer to be spaced from each other on the insulating layer;
    (c) forming a base metal layer on the conductive substrate including the insulating layer, the source electrode layer, and the drain electrode layer;
    (d) applying a photoresist on the conductive substrate, and forming a photoresist pattern exposing a portion of the base metal layer through a lithography process;
    (e) removing the exposed portion of the base metal layer to expose a portion of the insulating layer; and
    (f) carrying out electroplating using the conductive substrate and a metal to be plated as respective electrodes within an electrolyte solution,
    wherein electrons of a tunneling current passing through the insulating layer from the conductive substrate are bonded with ions of the metal within the electrolyte solution to form a metal channel layer on the portion of the insulating layer.

14. The method according to claim 13, wherein the photoresist pattern in (d) forming the photoresist determines a length or a width of the metal channel layer formed by the electroplating.

15. The method according to claim 13, wherein (e) removing the exposed portion includes:
(e1) providing the conductive substrate in which the photoresist pattern is formed with an electrolyte solution for electrolysis; and
(e2) applying a voltage to the electrolyte solution and the conductive substrate to carry out electrolysis on the electrolyte solution for electrolysis,
wherein the exposed metal of the base metal layer is ionized into the electrolyte solution for electrolysis by an oxidation reaction of the electrolysis to cause the exposed portion of the base metal layer to be etched.

16. The method according to claim 13, wherein (f) carrying out the electroplating includes applying a voltage between the source electrode layer and the drain electrode layer and measuring a current flowing between the source electrode layer and the drain electrode layer to determine whether the electroplating forming the metal channel layer is completed.

17. The method according to claim 13, further comprising:
(g) forming an upper gate dielectric film on the metal channel layer; and
(h) forming an upper gate electrode layer on the upper gate dielectric film.

* * * * *